United States Patent [19]

Bosna et al.

[11] Patent Number: 4,940,623
[45] Date of Patent: Jul. 10, 1990

[54] PRINTED CIRCUIT BOARD AND METHOD USING THERMAL SPRAY TECHNIQUES

[76] Inventors: Alexander A. Bosna, 135 Summit Rd., Malvern, Pa. 19355; Louis M. Riccio, P.O. Box 81, DeVault, Pa. 19432

[21] Appl. No.: 230,401

[22] Filed: Aug. 9, 1988

[51] Int. Cl.$^5$ ............................. B05B 5/00; B05D 3/06
[52] U.S. Cl. .................................... 428/158; 427/53.1; 427/96; 427/275; 427/307; 427/422; 427/423; 428/901
[58] Field of Search ................. 427/53.1, 307, 423, 427/422, 96, 275; 478/158, 159, 313.3, 313.7, 313.9, 173, 901

[56] References Cited

U.S. PATENT DOCUMENTS

| | | | |
|---|---|---|---|
| 4,508,754 | 4/1985 | Stepan | 427/275 |
| 4,532,152 | 7/1985 | Elarde | 427/423 |
| 4,643,798 | 2/1987 | Takada et al. | 427/307 |
| 4,781,968 | 11/1988 | Kellerman | 428/901 |

Primary Examiner—Stanley Silverman
Attorney, Agent, or Firm—Jim Zegeer

[57] ABSTRACT

A method of making printed circuit boards, particularly 3-Dimensional circuit boards, wherein a surface layer of micron sized hollow spheres, beads or spacers are ruptured or fractured in a pattern defining the electrical circuit. The circuit pattern is thermally sprayed with molten copper particles. The molten copper particles shape themselves to the nooks, crannies and undercuts of the fractured spheres or beads to mechanically lock the electrical circuitry to the board. The current carrying capacity can be adjusted by the thickness of the sprayed metal. The overspray does not adhere to smooth non porous surfaces adjacent the fractured spheres or beads.

5 Claims, 3 Drawing Sheets

PRINTED CIRCUIT BOARD AND METHOD USING THERMAL SPRAY TECHNIQUES

BACKGROUND AND BRIEF DESCRIPTION OF THE INVENTION

The present invention relates to printed boards and methods and processes of manufacturing same particularly three dimensional printed circuit boards. Currently, the art of printed circuit board manufacturing involves both subtractive and additive techniques. The subtractive processes are currently the most popular PC manufacturing technique and it involves a PC board which is entirely coated with copper. The holes are drilled and sensitized and electroless copper flashes used. The PC board artwork is used then to construct an acid-resistant shadow mask on the copper so that when submerged in acid the copper is eaten away leaving a pattern of conductive wires in the copper. This conductive pattern is the boards printed circuit.

In the additive process, the acid etching aspect is eliminated and this allows the manufacturers to improve their circuit board density and product yield. See Chapter 16 of the text "The Design and Drafting of Printed Circuits" by Darryl Lindsey, 1979, 1984, Published by Bishop Graphics entitled "Manufacturing Process of PC Boards".

In either system, a number of chemicals and chemical byproducts are used and/or generated, which creates problems when they cannot be reused and must be stored or disposed of safely.

There are problems with producing three dimensional printed circuit boards using these techniques. New techniques are required for this type of printed and plating is not trouble free with these new surfaces and substrate materials. The object of the present invention is to adapt the thermal spray bonding or adherence techniques disclosed in our U.S. Pat. Nos. 4,751,113; 4,521,475; 4,618,504; 4,714,623 (incorporated herein by reference) to forming printed circuit boards and particularly three dimensional printed circuit boards.

According to a preferred embodiment of the present invention, a mixture of resin and hollow micron-sized spheres or beads is applied to the surface of an electronic circuit board by injection molding or by lamination or other composite technology processes. A circuit pattern is etched in the surface by either laser etching, engraving, or other mechanical means such as high speed machining or abrasion. These processes serve to fracture the hollow micron-sized spheres or beads directly under the surface. The fractured surface is cleaned ultrasonically or with high velocity liquid spray to remove surface debris.

The top surface of the circuit board must be without microporosity or surface defects which would serve as anchor sites for sprayed metal. Very fine metal particles may find slight porosity on the surface and will tend to stick to the surface at these points. Normally, they can easily be scraped off the surface and hence do not affect the integrity of the circuit board.

In the preferred embodiment, the circuitry is formed slightly below or flush with the surface.

As an alternative method of preparing a printed circuit board utilizing the thermal spray processes according to the invention, the surface on which the circuit pattern is to be formed is screened with a circuit pattern onto the surface using a resin such as an epoxy. Secondly, the surface is "dusted" with hollow micron-sized spheres or beads in a manner disclosed our U.S. Pat. No. 4,714,623 so that the hollow micron-sized spheres or beads stick to the wet epoxy circuit pattern and are engulfed into the wet circuit pattern until the pattern is saturated with hollow micron-sized spheres or beads. Thirdly, the pattern is allowed to cure then it is lightly abraded to produce the voids, nooks, crannies and undercuts which serve as anchor sites for the sprayed metal. The surface is cleaned to remove any surface debris and, fourthly, the surface is then thermally sprayed with copper or other conductive metal.

In a third process, which somewhat resembles the second process or method and partakes of the process claimed in our U.S. Pat. No. 4,751,113. After silk screening the resin in the desired circuit pattern, and while the resin is still "wet" or uncured, it is thermally sprayed with copper and then the resin is cured. This third method is more dependent on the curing rate of the resin and various parameters such as potlife which determine the appropriate time to spray. Also, the gun distance must be such that the pattern is not distorted by the impingement of the molten particles. Additionally, the type resin used is a factor i.e. whether it's a uv ultraviolet (uv curing resin, a resin that cures only with heat) or a resin that cures with a combination of ultraviolet and heat.

All the above methods of thermally spraying an electronic circuit board depend on a non-porous smooth resin or substrate surface that prevents the sprayed particles from adhering accept where the pattern is established. The overspray is easily collectible and can be reprocessed for respraying whereas acids and other solutions used in the fabrication of other circuit boards are practically totally lost and present problems in storage and disposal.

Considering the large number of steps in fabricating conventional printed circuit boards (as is disclosed in the article referenced above), thermal spraying according to the present invention is a very economical process especially for surface mount boards. Thermal spraying may now be competitive with very fine lines or double sided boards which require plating through holes. In cases where plating through holes is required, inserts or tubular eyelets can be placed into the holes and crimped, and the conductive metal sprayed circuit pattern makes the connection between circuits on opposite sides of the board. In a preferred embodiment, the sprayed deposits should remain or be 2 to 3 mils below the top surface of the board. If the spray deposit fills the groove and starts to become flush with the surface, then the sprayed particles may spread from the edge of the pattern and thereby create rough edges. This may be objectionable for closely spaced combination lines as well for aesthetic or cosmetic reasons.

DESCRIPTION OF THE DRAWINGS

The above and other objects advantages and features of the invention will become more apparent when considered with the accompanying drawings wherein.

DETAILED DESCRIPTION OF THE INVENTION

Figure 1:
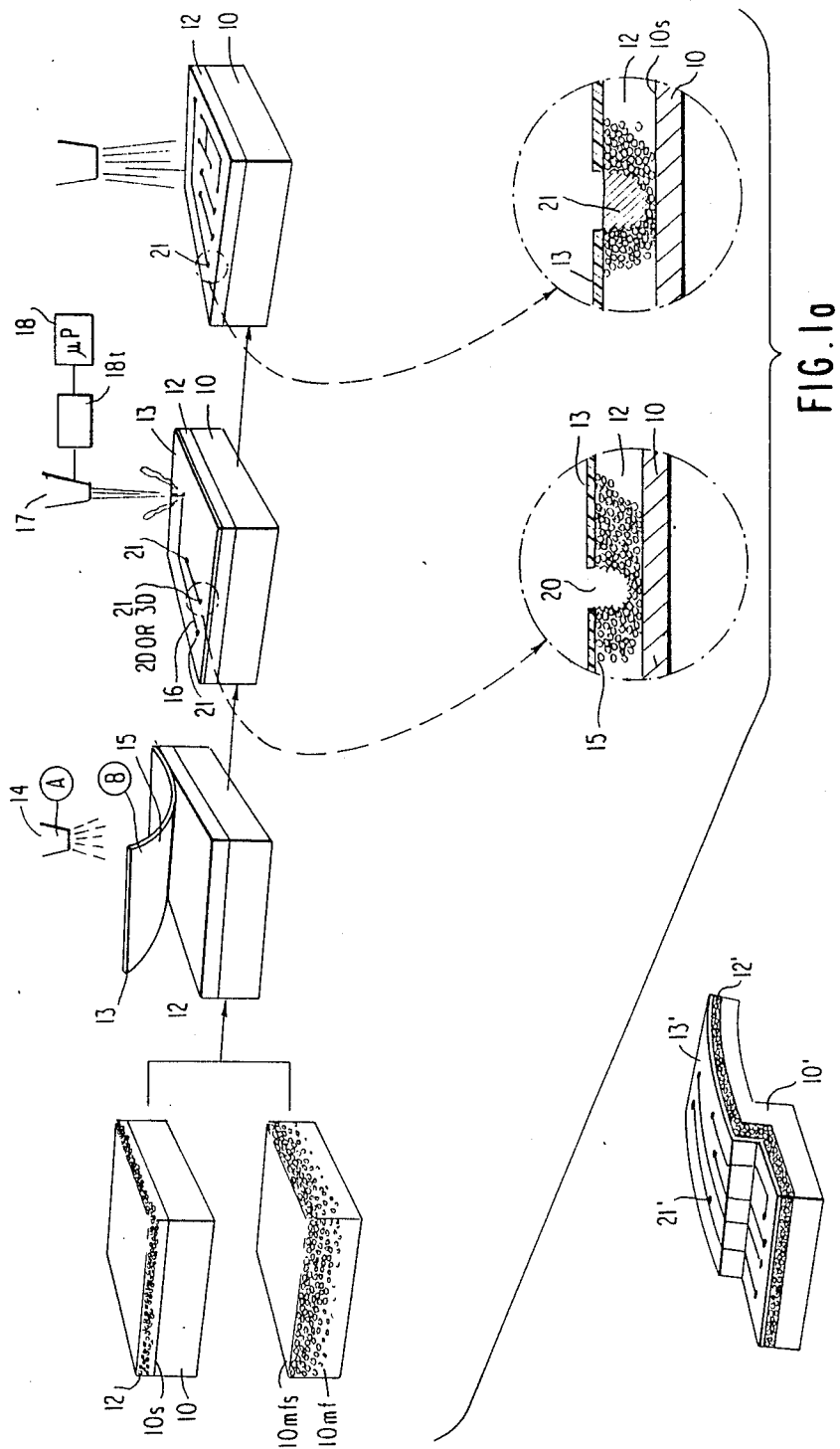
FIG. 1a is a diagrammatic illustration of a process carries out according to the preferred embodiment of the invention.
FIG. 1b is a diagrammatic illustration of a three dimensional circuit board made according to the invention.

In the preferred embodiment of the invention illustrated in FIG. 1a substrate 10, which may be a conventional fiber reinforced phenolic board, is coated with a mixture of resin (preferably an epoxy resin) and non-conductive inorganic hollow micron-sized spheres or beads 12 by injection molding, by lamination or any other composite technology process. For example, a layer of resin, filled with the hollow micron-sized spheres or beads can be screened, colandered or otherwise applied in a smooth layer to the surface 10S of board 10.

Alternatively, a layer of resin can be applied to board 10. Prior to curing of the layer of resin, the hollow micron-sized spheres or beads may be sprayed upon the surface of uncured resin (in the manner disclosed in our U.S. Pat. No. 4,714,623) to thereby form one or more layers of hollow micron-sized spheres or beads or a mixture of hollow micron-sized spheres or beads and resin may be applied to the substrate surface 10s and then cured.

As an alternative, a molded or cast or syntactic foam 10mf in which the voids have migrated to the surface 10mfs forms the surface to which the conductor material is ultimately adhered. Substrate 10 with the adhering hollow micron-sized sphere or bead layered 12 in the next phase has a dielectric film 13 applied to the surface 12 either by spraying from a sprayer 14 or applied by an adhesive 15 so as to be conformal to all points of the surface 12.

In the next phase illustrated, the circuit pattern is etched through the dielectric film or conformal coating 13 and into the hollow micron-sized sphere or bead layer 12. In the preferred embodiment the circuit pattern 16 is etched into the surface by a laser 17 which is controlled by a microproccessor 18 using multi-axis programmable tooling or controller 18t. It will be appreciated that the laser can be stationary and the circuit board manipulated both in x-y axis as well as z axis. In other words, for maximum efficiency of the laser etching, the laser beam should be maintained perpendicular to the surface being etched. Thus, in connection with the three dimensional circuit boards shown in FIG. 1b, the circuit board and/or the laser can be manipulated so as to maintain the surfaces perpendicular to the surface being etched.

As shown in FIG. 1a the balloon enlargement of an etched pattern, the laser beam burns a groove through the dielectric film and ruptures the bond coat hollow micron-sized sphere or bead filled resin layer 12 to form groove 20. It will be appreciated that circuit connection pads 21 can be formed in an area larger than the width of the groove for connection to external circuitry or for receiving the pins of board mounted circuit components such as integrated circuit chips, resisters, capacitors, coils, transformers and the like. Instead of the preferred laser etching, the circuit pattern can be formed by engraving or other mechanical means such as high speed machining or abrasion. In any case, the etching, abrading, engraving, etc. process serves the function of fracturing the hollow micron-sized spheres or beads directly under the surface in the circuit pattern desired to thereby form undercuts, nooks, and crannies which are illustrated in cross section in the balloon enlargement of phase three of FIG. 1a. The fractured surfaces are cleaned ultrasonically or with high velocity liquid spray to remove surface debris and than it is dried.

In phase 4, the engraved surface is thermally sprayed with copper (or other conductive metal or material which can include super-conductor substances which thus become an easy way to form these materials as wire conductors in any desired circuit pattern, on 3-D surfaces, etc.) to establish a conductive path for electronic circuitry. Typically, the paths are elongated pathways which are essentially grooves formed in the surface of the fractured hollow micron-sized spheres or beads. The top surface of the circuit board e.g. the dielectric film or layer 13 in this embodiment or the resin forming the hardened resin encapsulating the hollow micron-sized spheres or beads. Normally, the fine metal particles can be easily scraped off the surface because of the non porous nature of the resin surface and hence do not effect the integrity of the circuitry, the circuit preferably being slightly below or flush with the surface. For very fine conductive lines, thermal spray apparatus using finely powdered copper is preferred since this forms smaller molten particles or droplets which fill the groove and hollow micron-sized spheres or beads. The thickness of the conductor elements can be adjusted to accommodate for the current carrying capacity of the individual lines. In cases where the circuitry is known to be high current carrying circuitry a few more passes with the thermal spray makes the conductors slightly thicker e.g. a larger conductor area thereby carrying a larger current.

As noted above, the thermal spraying of the electronic circuit board depends on a smooth surface that prevents the sprayed particles from adhering except where the pattern of fractured or ruptured hollow micro-sized spheres or beads is established. The overspray is easily collectible and can be reprocessed for respraying which, in contrast to conventional PC board manufacturer where acids and other solutions are used in the fabrication of printed circuit boards, such materials are practically total losses and present problems of disposal and compliance with EPA restrictions.

Considering the large number of steps in conventional fabrication of printed circuit boards, as is reflected in the article referenced above from the Lindsey text, the present invention utilizing thermal spraying offers a very economical process especially for surface mount boards.

Where a double sided board is required, and holes are bored either using the laser or other hole boring techniques, instead of plating the holes, a tubular conductive insert such as copper rivets can be placed the hole and crimped into place so that when the conductor patters are sprayed in the laser etched grooves or conductor pattern, the spray contacts the tubular inserts to form the through connection.

In the preferred embodiment, the metal sprayed deposit should be two to three mils below the top surface of the board. If the spray deposit fills the groove and starts to become flush with the surface then the spray particles spread from the edge of the pattern and thereby can create rough edges which may be objectional for closely spaced lines as well as for cosmetic or aesthetic reasons. For these reason, it is preferred that the groove be deep enough so that the conductor filling the groove is sufficient to perform the function desired and yet be two to three mils below the top surface of the board as shown on the balloon enlargement coupled to phase 4 of the diagrammatic block diagram of FIG. 1a.

A three dimensional circuit board is shown in FIG. 1b and, the processing steps are essentially the same. In the phase three and phase four process steps, the circuit pattern is etched by either manipulating the circuit board so that the surface facing the laser is perpendicular thereto or the laser is manipulated for this purpose. Both the laser axis and the work piece can be simultaneously manipulated, if desired. Similarly, the thermal spray apparatus is preferably aligned perpendicular to the groove and the surface because when the circuit board the groove therein is held at any angle to the thermal spray, there is differential angular buildup of the metal on one side or the other side of the groove. Hence, the thermal spray should be perpendicular to the surface of the circuit pattern. However, if preferential build up on one side of the laser etched grove is desired, that can be accomplished by adjusting the relationship of the axis of the spray apparatus to the axis of the groove. Referring to the molded or cast structural foam in which the voids which have migrated to the surface illustrated in 1A as 10mf, this can be syntactic foam resin coating described in our U.S. Pat. Nos. 4,521,475 and 4,618,504. The hollow micron-sized spheres or beads are likewise described in detailed in these reference patents. The copper is preferably high conductivity copper and depending upon the application including the width and depth of the conductor lines to be formed, the copper can be in the form of wires or powders which are supplied to the thermal spray gun apparatus.

Figure 2:
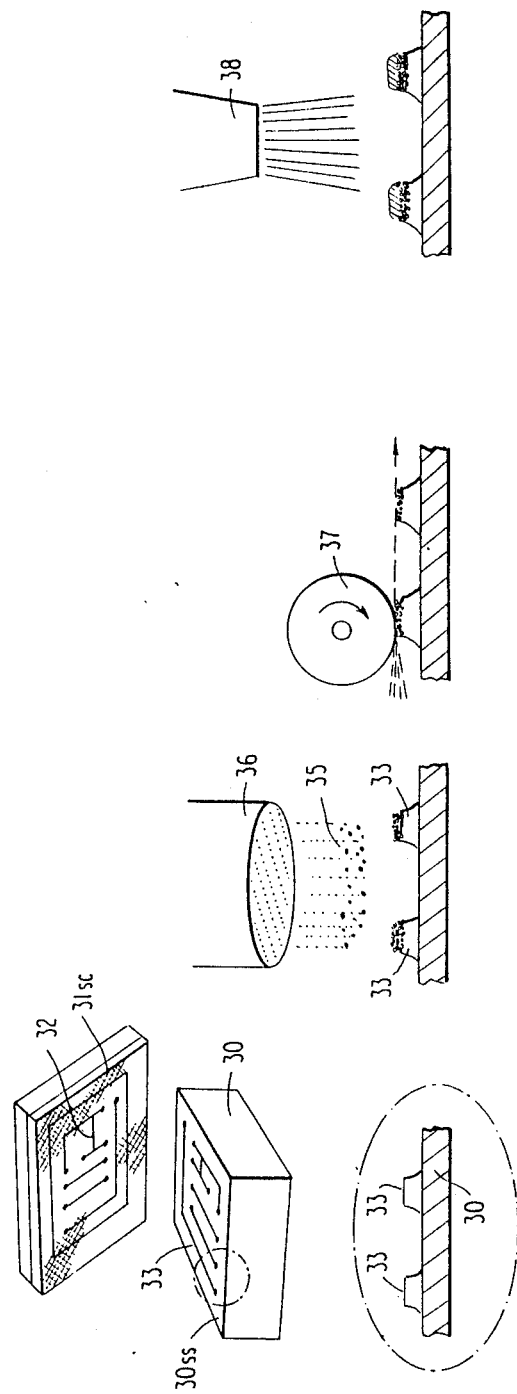
FIG. 2 is a diagrammatic block diagram illustrating a second preferred embodiment of the invention.

Referring now to the embodiment shown in FIG. 2, the PC board substrate 30 has the upper smooth surface thereof 30ss cleaned and a silkscreen 31sc having the circuit pattern 32 formed therein as a conventional silkscreen forming process applied to the surface 30ss and then the screen pattern of 33 is screened or squeegeed through the silkscreen 31scm. While the resin circuit pattern 33 is stilled uncured, the hollow micron-sized spheres or beads 35 are dusted from a supply 36 onto the uncured circuit pattern 33 and then the dusted pattern is cured. This is somewhat similar to the process disclosed in our U.S. Pat. No. 4,714,623. After the hollow micron-sized sphere or beads filled resin circuit pattern 33 is cured, the hollow micron-sized spheres or beads are fractured and/or ruptured by fracturing or abrading wheel 37 and the remains are removed.

Figure 3:
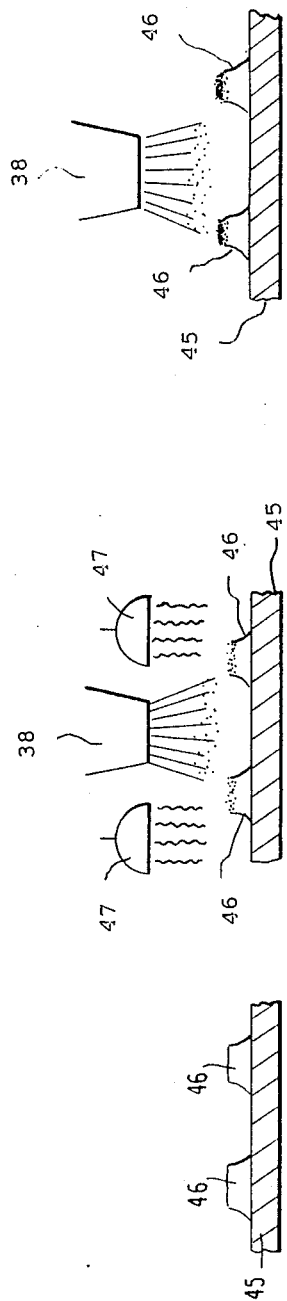
FIG. 3 is a diagrammatic block diagram illustrating the process according to a third embodiment of the invention.

Thereafter, a thermal spray gun 38 sprays molten copper on the surface. The copper particles preferentially adhered to the fractured hollow micron-sized sphere or bead pattern by bonding onto the voids, undercuts, and nooks, and crannies forming anchor sites for the copper. This overspray is easily collectible for reprocessing or respraying purposes as described above in connection with the embodiment described in connection with FIG. 1a. In a preferred embodiment the resin in an epoxy and the dusting of the surface of the hollow micron-sized spheres or beads is such that the hollow micron-sized spheres or beads stick to the wet circuit pattern and are engulfed into the wet pattern until the wet pattern is saturated (by 'wet' we mean 'uncured'). FIG. 3 illustrates a third technique which is similar to the method disclosed in our U.S. Pat. No. 4,751,113. In this case, the circuit pattern is screened onto the circuit board 45 and the uncured uv resin 46 is in the pattern of the circuit to be formed. Instead of using hollow micron-sized spheres or beads, the surface is exposed to ultraviolet followed by a thermal spray of copper into the partially cured resin. The ultraviolet lamps 47 can be used in conjuction with thermal spray gun 38 or separately. As indicated in phase three, additional copper is sprayed to build to a predetermined thickness if a higher current capacity is required. This last method is more dependent on the curing rate of the resin and various parameters such as potlife, which determine the appropriate time to spray. In addition, the gun—to work—distance must be considered since if it is too close, the circuit pattern may be distorted. Additionally, the type of resin used is a factor, i.e. a UV(ultraviolet) curing resin or a resin that cures with heat only or a resin that cures with a combination of heat and ultraviolet. The Henkel Corporation, ITEC, Dymax have developed two part systems. In the Henkel system, for example, called Duocure (TM) IPM (Inter Penetrating Polymer Network) a two part system of alphatic polyisocynate and a second component of an alphatic poloyl dissolved in a UV curable multifunctional acrylate. After adding a photo-initiator, the acrylate portion can be cured first using radiation then the cure of the polyurethane is completed using thermal curing. Both radiation and heat can be applied simultaneously. The ratios of acrylate and polyurethane can be tailored to a specific application.

While the invention have been shown and described with reference to a preferred practice of the invention, it would be understood that this disclosure is for purposes of illustration and various omissions and changes may be made thereto without departing from the spirit and the scope of the invention as set forth in the claims appended hereto.

What is claimed is:

1. A method of making a printed circuit comprising the following steps:
    (1) adhering one or more layers of hollow micron-sized spheres, beads or spaces to a surface of a substrate upon which said printed circuit is to be formed,
    (2) rupturing at least the surfaces ones of said hollow micron-sized spheres, beads or spaces in said pattern by a laser beam under the control of a computer to produce a circuit path of nooks, crannies and undercuts formed by the remains of laser ruptured hollow micron-sized spheres, beads or spaces adhered to said surface in the pattern of said printed circuit,
    (3) spraying electrically conductive metal on said ruptured hollow micron-sized spheres, beads or spaces to produce said printed circuit.

2. A method of making a printed circuit comprising the following steps:
    (1) adhering one or more layers of hollow micron-sized spheres, beads or spaces to a surface of a substrate upon which said printed circuit is to be formed by screening-on a resin layer in the pattern of said printed circuit, said resin layer containing said hollow micron-sized spheres, beads or spaces,
    (2) rupturing at least the surface ones of said hollow micron-sized spheres, beads or spaces to produce a circuit path of nooks, crannies and undercuts formed by the remains of ruptured hollow micron-sized spheres, beads or spaces adhered to said surface in the pattern of said printed circuit,
    (3) spraying molten electrically conductive metal on said remains so as to mechanically lock said molten metal in said nooks, crannies and undercuts.

3. A method of making a printed circuit comprising the following steps:
   (1) adhering one or more layers of hollow micron-sized spheres, beads or spaces to a surface of a substrate upon which is printed circuit is to be formed by applying a layer of resin filled with said hollow micron-sized spheres, beads or spaces to said surface,
   (2) laser beam etching said circuit pattern in said resin filled with hollow micron-sized spheres, beads or spaces to produce a circuit pattern of nooks, crannies and undercuts in said hollow micron-sized spheres, beads or spaces which lies below the outer surface of said layer of resin,
   (3) spraying electrically conductive metal on said ruptured hollow micron-sized spheres, beads or spaces to produce said printed circuit and wherein said molten metal does not extend to the outer surface of said resin.

4. The method defined in any one claims 1-3 wherein said sprayed molten electrically conductive metal is copper.

5. A printed circuit board made according to the method defined in any one of claims 1-4.

* * * * *